United States Patent
Goishi (10) Patent No.: US 7,623,984 B2
(45) Date of Patent: Nov. 24, 2009

(54) TEST APPARATUS AND ELECTRONIC DEVICE

(75) Inventor: Masaru Goishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 219 days.

(21) Appl. No.: 11/690,140

(22) Filed: Mar. 23, 2007

(65) Prior Publication Data

US 2008/0234969 A1 Sep. 25, 2008

(51) Int. Cl.
G01R 31/00 (2006.01)
G06F 11/00 (2006.01)
(52) U.S. Cl. ...................................... 702/124
(58) Field of Classification Search ................... 702/124
See application file for complete search history.

(56) References Cited

U.S. PATENT DOCUMENTS

| | | | | |
|---|---|---|---|---|
| 4,849,702 A | * | 7/1989 | West et al. | 327/160 |
| 5,153,883 A | * | 10/1992 | Hayashi et al. | 714/744 |
| 2004/0251924 A1 | * | 12/2004 | Sudou | 324/765 |
| 2007/0203659 A1 | * | 8/2007 | Yamaguchi et al. | 702/69 |
| 2007/0266290 A1 | * | 11/2007 | Yamada et al. | 714/742 |
| 2008/0232538 A1 | * | 9/2008 | Goishi | 377/19 |

FOREIGN PATENT DOCUMENTS

| | | |
|---|---|---|
| JP | 09096663 | 4/1997 |
| JP | 2003-057318 | 2/2003 |

* cited by examiner

*Primary Examiner*—Michael P. Nghiem
*Assistant Examiner*—Cindy H Khuu
(74) *Attorney, Agent, or Firm*—Osha • Liang LLP (57) ABSTRACT

There is provided a test apparatus for testing a device under test. The test apparatus includes first and second period generators that respectively generate test period signals indicating test periods for testing the device under test, a plurality of input/output sections that are provided in correspondence with a plurality of terminals of the device under test, wherein each of the plurality of input/output sections, in accordance with a test period supplied thereto, outputs a test signal to a corresponding one of the plurality of terminals and receives an output signal output from the corresponding terminal, and a plurality of selecting sections that are provided in correspondence with the plurality of input/output sections, wherein each of the plurality of selecting sections selects one of the test period signals generated by the first and second period generators so as to be supplied to a corresponding one of the plurality of input/output sections.

6 Claims, 5 Drawing Sheets

TEST APPARATUS AND ELECTRONIC DEVICE

BACKGROUND

1. Technical Field

The present invention relates to a test apparatus and an electronic device. More particularly, the present invention relates to a test apparatus and an electronic device which are configured in such a manner that a different test period can be selected for each test terminal.

2. Related Art

To test a device under test (DUT), a test apparatus generates a test signal for each test period, inputs the generated test signal into a terminal of the DUT, and receives an output signal from the terminal of the DUT in response to the test signal. The test apparatus then compares the received output signal with an expected value which is expected to be output from the DUT when the test signal is input into the DUT. This is how the test apparatus tests the functions of the DUT.

Here, the test period is generated by a period generator. In the test apparatus, one period generator is provided for each terminal group including, for example, 4 to 16 test terminals. In other words, the plurality of test terminals making up the terminal group corresponding to the period generator are under the control of the same test period. Unexamined Japanese Patent Application Publication No. H09-96663 discloses a period generator adopted for a test apparatus.

Here, it may be desired to use the test apparatus in order to test a device that has different periods for the input thereto and the output therefrom. For example, the test apparatus may be used to test a device that is input with a clock which has not been multiplied by a phase-locked loop and outputs data in synchronization with the clock which has been multiplied. If such is the case, a plurality of terminal groups each including a plurality of test terminals are provided in the DUT so that different test periods can be applied to the test terminals of the DUT.

However, this solution has a drawback. When only one of the test terminals constituting a terminal group is utilized, the rest of the test terminals can not be used. Furthermore, this may limit the arrangement of the remaining test terminals of the DUT. As a different solution, a period generator may be provided for each test terminal. This technique, however, increases the scale of the circuit for the test apparatus, and is therefore not a realistic solution.

SUMMARY

In view of the above, an advantage of some embodiments of the present invention is to provide a test apparatus and an electronic device which can solve the above-mentioned problems. This advantage is achieved by combining the features recited in the independent claims. The dependent claims define further effective specific example of the present invention.

A first embodiment of the present invention provides a test apparatus for testing a device under test. The test apparatus includes first and second period generators that respectively generate test period signals indicating test periods for testing the device under test, a plurality of input/output sections that are provided in correspondence with a plurality of terminals of the device under test, wherein each of the plurality of input/output sections, in accordance with a test period supplied thereto, outputs a test signal to a corresponding one of the plurality of terminals and receives an output signal output from the corresponding terminal, and a plurality of selecting sections that are provided in correspondence with the plurality of input/output sections, wherein each of the plurality of selecting sections selects one of the test period signals generated by the first and second period generators so as to be supplied to a corresponding one of the plurality of input/output sections.

Here, all the necessary features of the present invention are not listed in the summary. The sub-combinations of the features may become the invention.

DESCRIPTION OF EXEMPLARY EMBODIMENT

Hereinafter, one aspect of the present invention will be described through an embodiment. The embodiment does not limit the invention according to the claims, and all the combinations of the features described in the embodiment are not necessarily essential to means provided by aspects of the invention.

Figure 1:
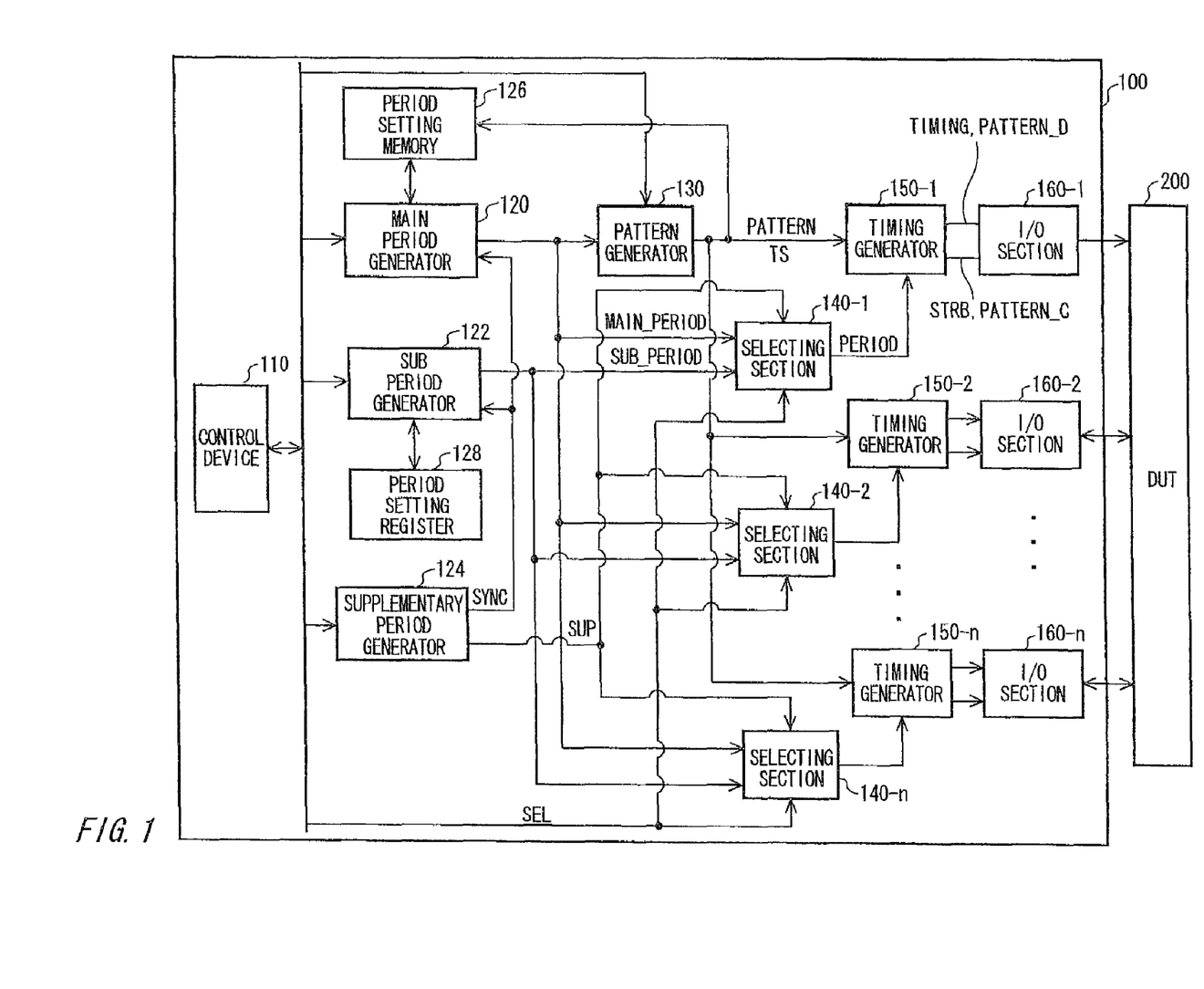
FIG. 1 illustrates an example of a test apparatus relating to an embodiment of the present invention, together with a DUT.

FIG. 1 illustrates the configuration of a test apparatus 100 relating to an embodiment of the present invention, together with a DUT 200. The test apparatus 100 tests the DUT 200. The DUT 200 may be a memory LSI such as a Dynamic Random Access Memory (DRAM) and a flash memory, a logic IC, a logic LSI or the like.

Here, the test apparatus 100 tests one or more DUTs 200. The test apparatus 100 includes therein a control device 110, a main period generator 120, a sub period generator 122, a supplementary period generator 124, a period setting memory 126, a period setting register 128, a pattern generator 130, selecting sections 140-1 to 140-n, timing generators 150-1 to 150-n, and input/output (I/O) sections 160-1 to 160-n. Note that the reference numerals for a plurality of constituents of the same type are expressed by a main number XXX and a sub number Y combined with a hyphen to each other (XXX-Y), for example, the selecting sections 140-1 to 140-n. In the following description, when it is not necessary to distinguish the constituents of the same type from each other, only the main number is used as the reference numeral, for example, the selecting section(s) 140.

The control device 110 is a computer system, for example. The control device 110 controls the tests to be conducted on the DUT 200 in accordance with programs. Specifically speaking, the control device 110 generates selecting signals SEL which are used by the selecting sections 140 to select one of the test periods generated by the main period generator 120 and sub period generator 122.

The main period generator 120 generates a main test period signal MAIN_PERIOD indicating a test period for testing the DUT 200. The main period generator 120 defines a period of each of the test cycles included in a test (test period) based on the main test period signal MAIN_PERIOD. The main period generator 120 may assign the same or a different length for each test period. In other words, the main period generator 120 may be a variable period generator which is capable of generating the main test period signal MAIN_PERIOD indicating a different length for each test period. When selected by any one of the selecting sections 140 (described later), the main test period signal MAIN_PERIOD is supplied, as a test period signal PERIOD, to a corresponding one of the timing generators 150 and a corresponding one of the I/O sections 160. Here, the timing generators 150 and I/O sections 160 are provided in a one-to-one correspondence with the test terminals.

The sub period generator 122 generates a sub test period signal SUB_PERIOD indicating a test period for testing the DUT 200. The sub period generator 122 defines a period of each of the test cycles included in a test (test period) based on the sub test period signal SUB_PERIOD. The sub period generator 122 may be capable of assigning a different length for each test period, similarly to the main period generator 120, or may have a simpler configuration than the main period generator 120, which assigns the predetermined same length for each test period. In other words, the sub period generator 122 may be a fixed period generator which generates the sub test period signal SUB_PERIOD indicating a predetermined length for each test period. When selected by any one of the selecting sections 140 (described later), the sub test period signal SUB_PERIOD is supplied, as the test period signal PERIOD, to a corresponding one of the timing generators 150 and a corresponding one of the I/O sections 160. Here, the timing generators 150 and I/O sections 160 are provided in a one-to-one correspondence with the test terminals.

The main period generator 120 and sub period generator 122 are provided in correspondence with each terminal group made up by a plurality of test terminals. The main test period signal MAIN_PERIOD and the sub test period signal SUB_PERIOD respectively generated by the main period generator 120 and sub period generator 122 may each have a value obtained by adding a decimal fraction to an integral multiple of a reference clock which operates the sections of the test apparatus 100. The main period generator 120 and sub period generator 122 can synchronize the start timings of the main test period signal MAIN_PERIOD and sub test period signal SUB_PERIOD, based on a start signal from the control device 110. Here, the test period indicates a duration of one cycle of a test signal to be supplied to the DUT 200 or a duration of one cycle of an output signal output from the DUT 200, that is to say, a cycle of driver control or a cycle of comparator control.

The supplementary period generator 124 generates a supplementary test period signal SUP which is equal to a least common multiple of the test period signals respectively generated by the main period generator 120 and sub period generator 122. Also, the supplementary period generator 124 can generate a synchronization signal SYNC. By using the synchronization signal SYNC, the supplementary period generator 124 can synchronize its own start timing with the start timings of the main period generator 120 and sub period generator 122. In this way, the main period generator 120, sub period generator 122, and supplementary period generator 124 can synchronously start generating the test periods and the period equal to the least common multiple of the test periods. Here, the start timings of the main period generator 120, sub period generator 122, and supplementary period generator 124 may be synchronized to each other by means of the start signal from the control device 110, instead of by means of the synchronization signal SYNC.

The period setting memory 126 stores thereon the lengths for the test period to be generated by the main period generator 120. One of the lengths is selected for the test period in accordance with the value of period information included in a test pattern generated by the pattern generator 130 (described later). Which is to say, the main period generator 120 selects one of the lengths for the test period which are stored on the period setting memory 126, based on the period information included in the test pattern. The main period generator 120 then generates the main test period signal MAIN_PERIOD in accordance with the selected length for the test period.

The period setting register 128 stores thereon the length for the test period to be generated by the sub period generator 122. The period setting register 128 may store thereon a fixed length for the test period. The sub period generator 122 generates the sub test period signal SUB_PERIOD based on the length of the test period stored on the period setting register 128.

The pattern generator 130 generates, in synchronization with each test period generated by the main period generator 120, a test pattern to test the DUT 200 and an expected value pattern which indicates a pattern of an output signal expected to be output from the DUT 200 when a test signal generated based on the test pattern is supplied to the DUT 200. The test pattern and expected value pattern are collectively referred to as "a pattern PATTERN" herein. In addition, the pattern generator 130 generates a timing set TS corresponding to the pattern PATTERN. The pattern generator 130 supplies the generated pattern PATTERN and timing set TS to the timing generators 150 (described later). The pattern generator 130 is, for example, a sequential pattern generator for generating a test pattern in accordance with an instruction sequence of a test program, or an algorithmic pattern generator for generating a test pattern based on a predetermined algorithm.

The selecting sections 140 each select one of the main test period signal MAIN_PERIOD generated by the main period generator 120 and the sub test period signal SUB_PERIOD generated by the sub period generator 122. The selecting section 140 supplies the selected signal to a corresponding one of the timing generators 150 as the test period signal PERIOD. Here, the selecting section 140 makes the selection between the main test period signal MAIN_PERIOD and sub test period signal SUB_PERIOD based on the selecting signal SEL from the control device 110. Furthermore, the selecting section 140 receives the supplementary test period signal SUP generated by the supplementary period generator 124 and switches the signal between the main test period signal MAIN_PERIOD and sub test period signal SUB_PERIOD in synchronization with the supplementary test period signal SUP.

Figure 2:
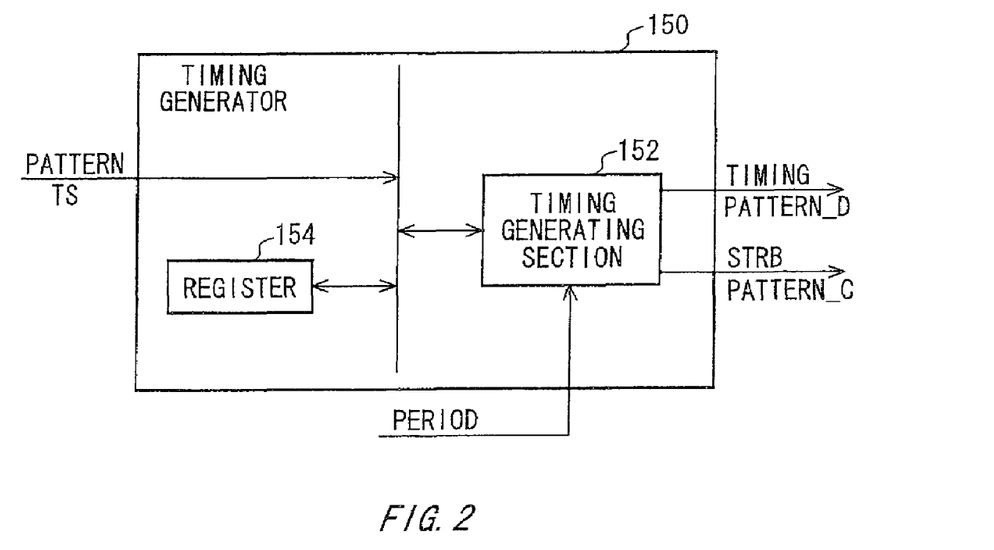
FIG. 2 illustrates an example of a timing generator relating to the present embodiment.

FIG. 2 illustrates, as an example, the timing generators 150 relating to the present embodiment. The timing generators 150 each supply the tests pattern PATTERN_D, the expected value pattern PATTERN_C, a timing signal TIMING and a strobe signal STRB to a corresponding one of the I/O sections 160, in synchronization with a test period determined based on the test period signal PERIOD. The test pattern PATTERN_D may be used to generate a test signal to be supplied to the DUT 200. The expected value pattern PATTERN_C may be compared by the comparing section (described later) with the output signal from the DUT 200. The timing signal TIMING may indicate the timing for the test signal to be supplied to the DUT 200. The strobe signal STRB may indicate the timing at which the output signal from the DUT 200 is compared with the expected value pattern.

The timing generator 150 includes therein a timing generating section 152 and a register 154. The timing generating section 152 generates the timing signal TIMING and strobe signal STRB based on the timing set TS. The register 154 stores thereon a pattern and a timing set which are to be used when the sub test period signal SUB_PERIOD generated by the sub period generator 122 is selected for the test period signal PERIOD.

When the main test period signal MAIN_PERIOD is selected as the test period signal PERIOD, the timing generator 150 generates the test pattern PATTERN_D and the like by using the pattern PATTERN and timing set TS from the pattern generator 130. On the other hand, when the sub test period signal SUB_PERIOD is selected as the test period signal PERIOD, the timing generator 150 generates the test pattern PATTERN_D and the like by using the pattern PATTERN and timing set TS stored on the register 154.

Figure 3:
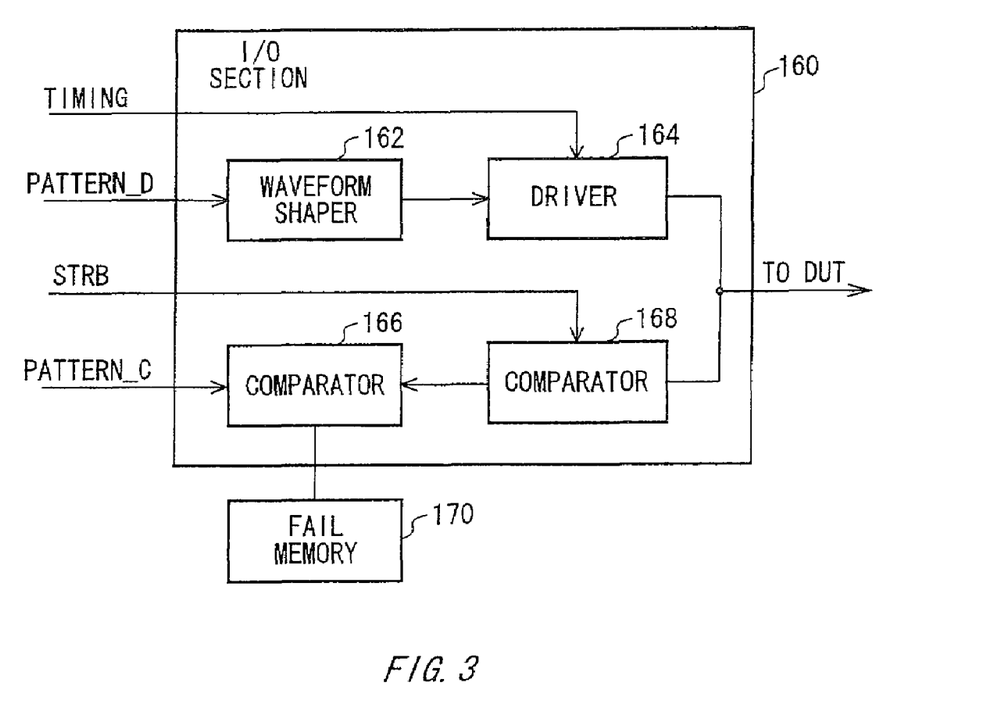
FIG. 3 illustrates an example of an input/output (I/O) section relating to the present embodiment.

FIG. 3 illustrates, as an example, the I/O sections 160 relating to the present embodiment. The I/O sections 160 are provided in correspondence with a plurality of test terminals of the DUT 200. The I/O sections 160 each output a test signal to a corresponding one of the test terminals or receive an output signal output from the corresponding test terminal, in synchronization with the test period signal PERIOD supplied thereto. The I/O sections 160 each include therein a waveform shaper 162, a driver 164, a comparator 166 and a comparator 168.

The waveform shaper 162 shapes the waveform of the test pattern PATTERN_D supplied by one of the pattern generator 130 and register 154. The waveform shaper 162 generates a signal as a result of shaping the waveform of the test pattern PATTERN_D, and supplies the generated signal to the driver 164. The driver 164 generates a test signal by driving, to the logical value H or logical value L, the value of the signal input thereto by the waveform shaper 162 in synchronization with a timing indicated by the timing signal TIMING. The driver 164 supplies the generated test signal to the DUT 200.

The comparator 166 judges whether the output from the comparator 168 matches the expected value pattern PATTERN_C supplied from one of the pattern generator 130 and register 154. The comparator 166 outputs the result of the judgment to a fail memory 170. The comparator 168 obtains the output signal from the DUT 200 in synchronization with a timing indicated by the strobe signal STRB. The comparator 168 outputs the obtained signal to the comparator 166. The fail memory 170 stores thereon the result of the comparison made by the comparator 166.

As described above, the test apparatus 100 relating to the present embodiment has the main period generator 120 and sub period generator 122 for each group of a plurality of test terminals. The selecting sections 140 each select one of the main test period signal MAIN_PERIOD and sub test period signal SUB_PERIOD generated by the period generators 120 and 122. The selected test period signal is supplied to a corresponding one of the timing generators 150 and a corresponding one of the I/O sections 160, where the timing generators 150 and I/O sections 160 are provided in a one-to-one correspondence with the test terminals. Having the above-described configurations, the test apparatus 100 relating to the present embodiment can select one of the main test period signal MAIN_PERIOD and sub test period signal SUB_PERIOD, and use the selected test period signal for each of the test terminals. As a result, when the test apparatus 100 is used to test a device with an input thereto and all output therefrom which are not synchronized and have different periods, a wasteful use of the test terminals can be prevented, and the test terminals can be efficiently arranged.

According to the test apparatus 100 relating to the present embodiment, the main period generator 120 is a variable period generator for generating the main test period signal MAIN_PERIOD indicating a different length for each test period. On the other hand, the sub period generator 122 is a fixed period generator for generating the sub test period signal SUB_PERIOD indicating a predetermined length for each test period. With the above-described configurations, the main test period signal MAIN_PERIOD can be used for an I/O terminal corresponding to, for example, a terminal outputting data synchronized with a clock generated by a PLL multiplying or dividing an original clock, and the sub test period signal SUB_PERIOD can be used for an I/O terminal corresponding to, for example, a terminal receiving the original clock which has not been multiplied by the PLL. Consequently, the test apparatus 100 relating to the present embodiment can be excellently used for a DUT having an input of a clock and an input/output which is synchronized with a signal generated by multiplying or dividing the input clock.

According to the test apparatus 100 relating to the present embodiment, the lengths for the test period to be generated by the main period generator 120 are stored on the period setting memory 126. On the other hand, the length for the test period to be generated by the sub period generator 122 is stored on the period setting register 128. With these configurations, the period setting memory 126 stores thereon a plurality of lengths for the test period so as to realize a variable period generator as the main period generator 120. On the other hand, the period setting register 128 stores thereon the single length for the test period so as to realize a fixed period generator as the sub period generator 122. The period setting register 128 is a simple register, which reduces an increase in circuit scale. As a result, the manufacturing cost of the test apparatus 100 relating to the present embodiment can be reduced.

Figure 4:
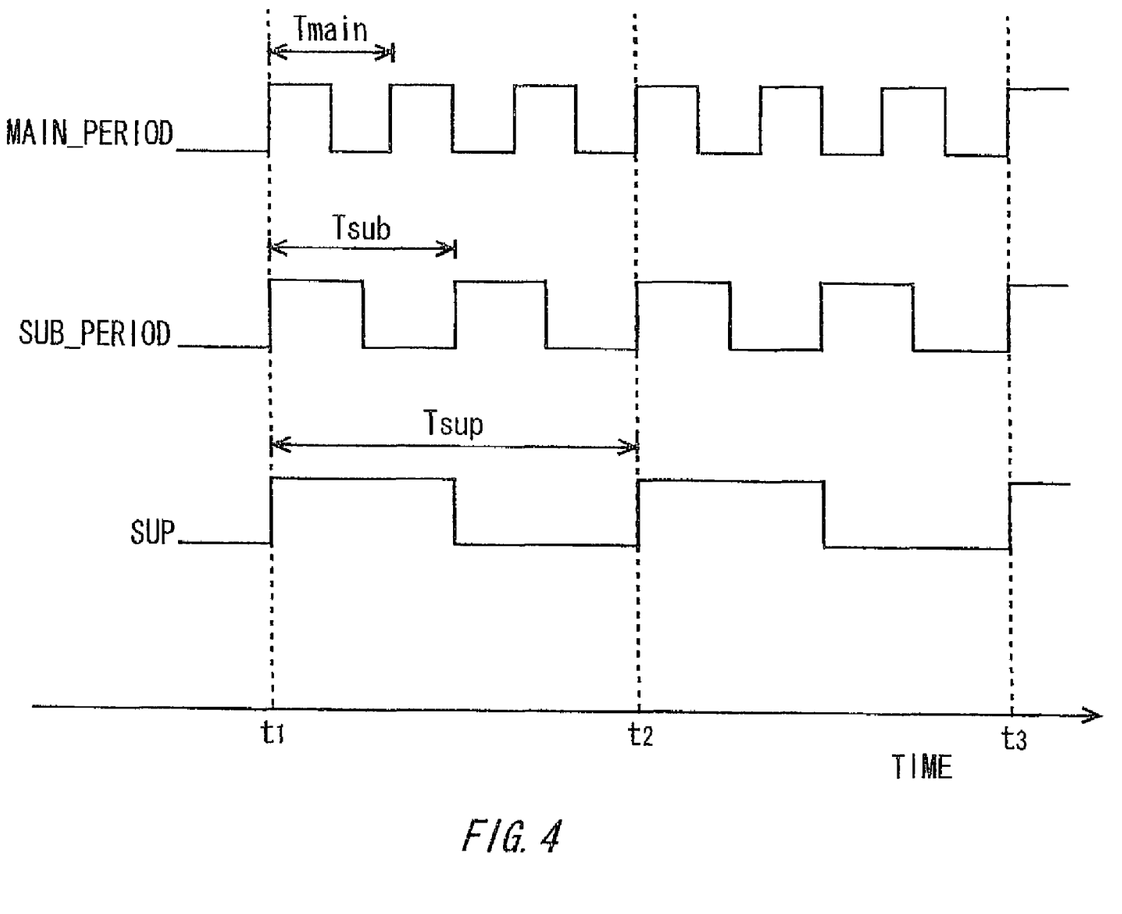
FIG. 4 illustrates, as an example, test period signals generated by period generators relating to the present embodiment.

FIG. 4 illustrates, as an example, the test period signals generated by the respective period generators in the test apparatus 100 relating to the present embodiment. FIG. 4 shows, from the top, the main test period signal MAIN_PERIOD generated by the main period generator 120, the sub test period signal SUB_PERIOD generated by the sub period generator 122, and the supplementary test period signal SUP generated by the supplementary period generator 124.

The main test period signal MAIN_PERIOD, sub test period signal SUB_PERIOD, and supplement test period signal SUP respectively have a period Tmain, a period Tsub and a period Tsup. The period Tmain is equal to two-thirds of the period Tsub, and equal to one-third of the period Tsup. Specifically speaking, when the period Tmain is 2, fox example, the period Tsub is 3, and the period Tsup is 6. As can be seen, the period Tsup is equal to a least common multiple of the periods Tmain and Tsub. Here, the starts of the respective test period signals are synchronized with each other. The synchronization can be established based on the synchronization signal SYNC from the supplementary period generator 124.

Since the period Tsup is equal to a least common multiple of the periods Tmain and Tsub, the rising timing of the supplementary test period signal SUP can be synchronized with the rising timings of the main test period signal MAIN_PERIOD and the sub test period signal SUB_PERIOD. Referring to FIG. 4, the rising timings t1, t2 and t3 of the supplementary test period signal SUP are all synchronized with the rising timings of the main test period signal MAIN_PERIOD and sub test period signal SUB_PERIOD. Since the test period signals are synchronized with each other in the above-described manner, the selection can be switched between the main test period signal MAIN_PERIOD and the sub test period signal SUB_PERIOD, in synchronization with the rising timing (t1, t2, t3 and the like) of the supplementary test period signal SUP. At the above-mentioned timings t1, t2 and t3, the values of the main test period signal MAIN_PERIOD and sub test period signal SUB_PERIOD are both set at the logical value H. Therefore, the selection can be switched between the test period signals without a problem.

According to the test apparatus 100 relating to the present embodiment, one of the main test period signal MAIN_PERIOD and the sub test period signal SUB_PERIOD can be selected and used for each of the test terminals, as described above. As a consequence, a wasteful use of the test terminals can be prevented and the test terminals can be efficiently arranged.

According to the above description, each selecting section 140 switches the selection between the main test period signal MAIN_PERIOD and the sub test period signal SUB_PERIOD, in synchronization with the supplementary test period signal SUP, in the test apparatus 100 relating to the present embodiment. However, the selecting section 140 is capable of switching the selection between the main test period signal MAIN_PERIOD and sub test period signal SUB_PERIOD at any desired timing. Here, when the selection is switched to the sub test period signal SUB_PERIOD when the value thereof is set at the logical value L, immediately after the value of the main test period signal MAIN_PERIOD rises to the logical value H, the value of the test period signal goes back to the logical value L immediately after becoming the logical value H. This may possibly cause undesirable phenomena such as interference of the test signal in some embodiments. The following describes an exemplary solution for this problem.

Figure 5:
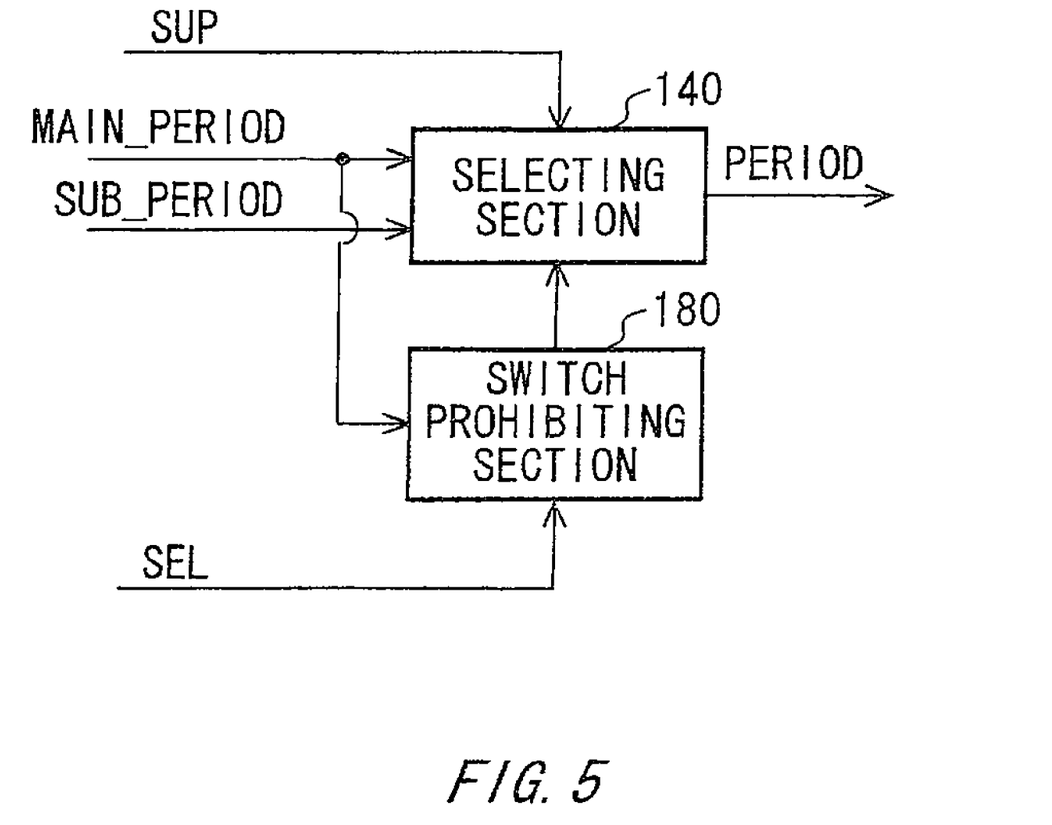
FIG. 5 illustrates a modification example of the present embodiment, where a switch prohibiting section is provided.

FIG. 5 illustrates a modification example in which a switch prohibiting section 180 is provided in each of the selecting sections 140. The switch prohibiting section 180 detects a start of the test period indicated by the main test period signal MAIN_PERIOD, in other words, detects a change of the value of the main test period signal MAIN_PERIOD from the logical value L to the logical value H. The switch prohibiting section 180 prohibits the selecting section 140 from switching the selection from the main test period signal MAIN_PERIOD to the sub test period signal SUB_PERIOD, during a predetermined prohibit period starting from the start of the test period (starting from the timing at which the value rises to the logical value H). Switching the selection from the main test period signal MAIN_PERIOD to the sub test period signal SUB_PERIOD can be prohibited by maintaining the enabled state of the selecting signal SEL during the prohibit period.

Figure 6:
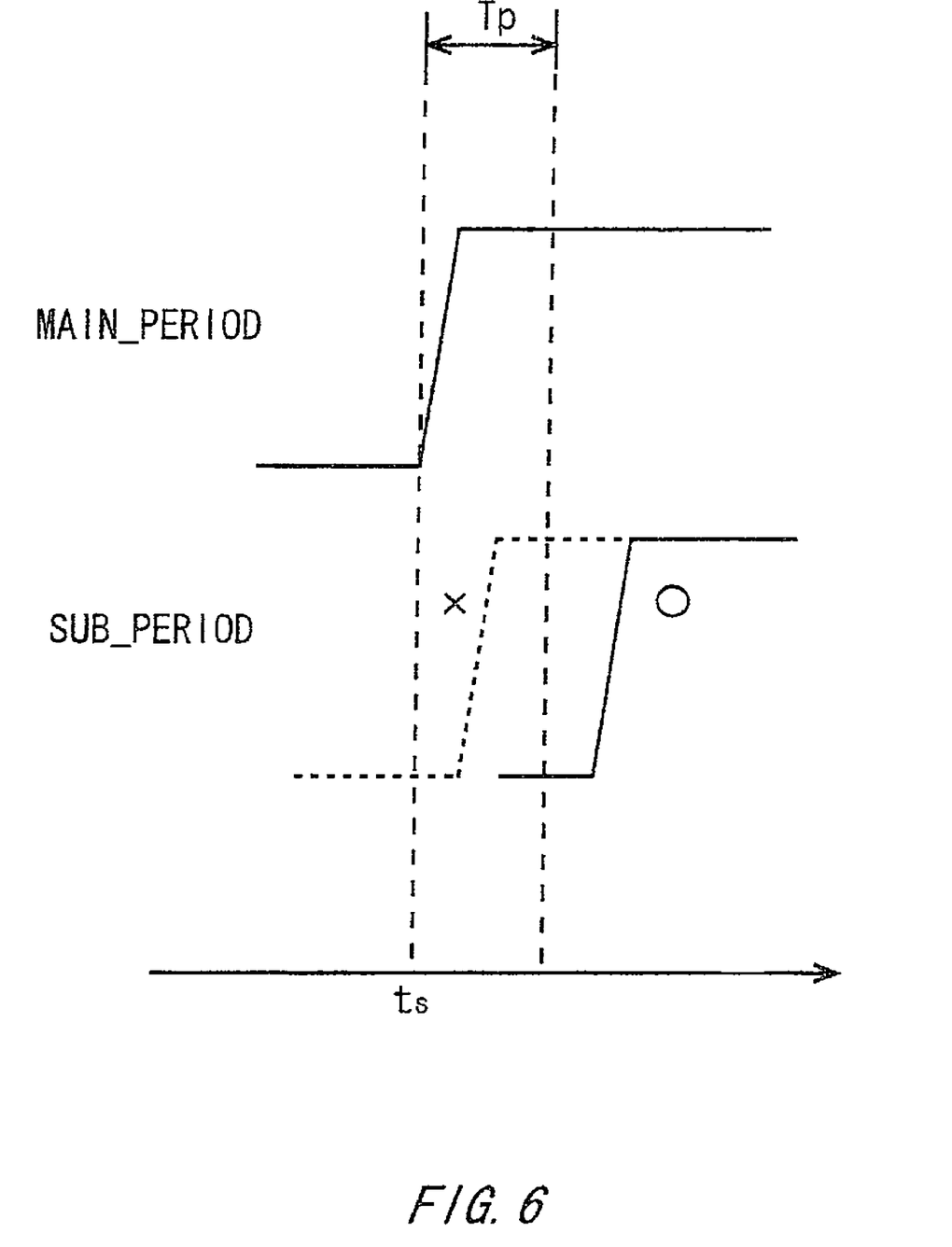
FIG. 6 illustrates, as an example, the test period signals which are used when the switch prohibiting section is provided.

FIG. 6 illustrates the timings of the main test period signal MAIN_PERIOD and sub test period signal SUB_PERIOD which are observed when the above-mentioned prohibit period is adopted. At the time ts, the value of the main test period signal MAIN_PERIOD rises from the logical value L to the logical value H. In other words, the test period indicated by the main test period signal MAIN_PERIOD starts at the time ts. At the time ts, the switch prohibiting section 180 detects the change in the value of the main test period signal MAIN_PERIOD, and starts the prohibit period Tp. During the prohibit period Tp, switching the selection to the sub test period signal SUB_PERIOD is prohibited.

In FIG. 6, the prohibition is indicated by the dotted line and cross mark. Once the prohibit period Tp elapses, switching the selection to the sub test period signal SUB_PERIOD is again permitted. In FIG. 6, the solid line and circle indicate that the prohibition of switching the selection to the sub test period signal SUB_PERIOD is released and the switching is permitted.

When the selection is switched to the sub test period signal SUB_PERIOD if shown by the dotted line in FIG. 6, the value of the test period signal significantly changes within a short time period, which may possibly cause undesirable consequences such as a surge. However, the modification example with the switch prohibiting section 180 does not have such drawbacks. Once the prohibit period Tp elapses, switching the selection to the sub test period signal SUB_PERIOD, which is indicated by the solid line in FIG. 6, does not cause a change, within a short time period, in the value of the test period signal from the logical value H to the logical value L. Therefore, it is not likely to cause undesirable consequences such as a surge. With the switch prohibiting section 180 being provided, the test apparatus 100 can prevent undesirable consequences such as a surge from occurring when the selection is switched from the main test period signal MAIN_PERIOD to the sub test period signal SUB_PERIOD at any desired timing.

The above-described switch prohibiting section 180 can be similarly applied for a case where the selection is switched from the sub test period signal SUB_PERIOD to the main test period signal MAIN_PERIOD. According to the above modification example, the switching is instructed by means of the selecting signal SEL. However, the switching may be alternatively instructed by means of the test pattern.

While one aspect of the present invention has been described through the embodiment, the technical scope of the invention is not limited to the above described embodiment. It is apparent to persons skilled in the art that various alternations and improvements can be added to the above-described embodiment. It is also apparent from the scope of the claims that the embodiment added with such alternations or improvements can be included in the technical scope of the invention.

For example, the sub period generator 122 is a fixed period generator according to the above-described embodiment. However, the sub period generator 122 may be a variable period generator similarly to the main period generator 120.

The test apparatus 100 may be a test circuit provided in an electronic device in which a circuit under test to be tested by the test circuit is also provided. The test circuit is configured by a BIST circuit or the like of the electronic device. The test circuit tests the circuit under test in order to, for example, judge the acceptability of the electronic device. By conducting the test, the test circuit can examine whether the circuit under test can realize normal operations or functions corresponding to the original purpose of the electronic device.

Alternatively, the test apparatus 100 may be a test circuit provided in a board or apparatus in which a circuit under test to be tested by the test circuit is also provided. Such a test circuit can also examine whether the circuit under test can realize normal operations or functions corresponding to the original purpose of the board or apparatus, similarly to the above-mentioned case.

As clearly seen from the above description, an embodiment of the present invention can realize a test apparatus and an electronic device which can prevent a wasteful use of test terminals. Also, the embodiment of the present invention can realize a test apparatus and an electronic device which enable test terminals to be efficiently arranged.

What is claimed is:

1. A test apparatus for testing a device under test, comprising:
   first and second period generators that respectively generate test period signals indicating test periods for testing the device under test;
   a plurality of input/output sections that are provided in correspondence with a plurality of terminals of the device under test, each of the plurality of input/output sections, in accordance with a test period signal supplied thereto, outputting a test signal to a corresponding one of the plurality of terminals and receiving an output signal output from the corresponding terminal;
   a plurality of selecting sections that are provided in correspondence with the plurality of input/output sections, each of the plurality of selecting sections selecting one of the test period signals generated by the first and second period generators to be supplied to a corresponding one of the plurality of input/output sections; and
   a third period generator that generates a period equal to a least common multiple of the test periods generated by the first and second period generators,
   wherein
      the first, second and third period generators synchronously start generating the test periods and the period equal to the least common multiple of the test periods, and
      each of the plurality of selecting sections switches the selection between the test period signals generated by the first and second period generators in synchronization with the period generated by the third period generator, and supplies the selected test period signal to the corresponding input/output section.

2. The test apparatus as set forth in claim 1, wherein
   the first period generator is a variable period generator which generates a test period signal having a different length for each test period, and
   the second period generator is a fixed period generator which generates a test period signal having a predetermined length for each test period.

3. The test apparatus as set forth in claim 2, further comprising:
   a pattern generator that generates a test pattern to test the device under test in accordance with each test period generated by the first period generator;
   a period setting memory that stores thereon a length for the test period to be generated by the first period generator, in association with a value of period information which is included in the test pattern and used for test period length selection; and
   a period setting register that stores thereon a length for the test period to be generated by the second period generator,
   wherein
      the first period generator generates the test period signal based on the length stored on the period setting memory in association with the period information included in the test pattern, and
      the second period generator generates the test period signal based on the length stored on the period setting register.

4. A test apparatus for testing a device under test, comprising:
   first and second period generators that respectively generate test period signals indicating test periods for testing the device under test;
   a plurality of input/output sections that are provided in correspondence with a plurality of terminals of the device under test, each of the plurality of input/output sections, in accordance with a test period signal supplied thereto, outputting a test signal to a corresponding one of the plurality of terminals and receiving an output signal output from the corresponding terminal;
   a plurality of selecting sections that are provided in correspondence with the plurality of input/output sections, each of the plurality of selecting sections selecting one of the test period signals generated by the first and second period generators to be supplied to a corresponding of the plurality of input/output sections;
   a switch prohibiting section that prohibits each of the plurality of selecting sections from switching the selection of one of the first and second period generators which supplies a test signal to the corresponding input/output section, from the first period generator to the second period generator, during a prohibit period which has a predetermined length and starts from a start of the test period indicated by the test period signal generated by the first period generator.

5. An electronic device including therein a test circuit and a circuit under test to be tested, wherein
   the test circuit comprises:
      first and second period generators that respectively generate test period signals indicating test periods for testing the circuit under test;
      a plurality of input/output sections that are provided in correspondence with a plurality of interface terminals of the circuit under test, each of the plurality of input/output sections, in accordance with a test period signal supplied thereto, outputting a test signal to a corresponding one of the plurality of interface terminals and receiving an output signal output from the corresponding interface terminal;
      a plurality of selecting sections that are provided in correspondence with the plurality of input/output sections, each of the plurality of selecting sections selecting one of the test period signals generated by the first and second period generators to be supplied to a corresponding one of the plurality of input/output sections; and
      a third period generator that generates a period equal to a least common multiple of the test periods generated by the first and second period generators,
   the first, second and third period generators synchronously start generating the test periods and the period equal to the least common multiple of the test periods, and
   each of the plurality of selecting sections switches the selection between the test period signals generated by the first and second period generators in synchronization with the period generated by the third period generator, and supplies the selected test period signal to the corresponding input/output section.

6. The test apparatus as set forth in claim 1, further comprising:
   a switch prohibiting section that prohibits each of the plurality of selecting sections from switching the selection of one of the first and second period generators which supplies a test signal to the corresponding input/output section, from the first period generator to the second period generator, during a prohibit period which has a predetermined length and starts from a start of the test period indicated by the test period signal generated by the first period generator.

* * * * *